United States Patent [19]

Laganza et al.

[11] Patent Number: 5,727,685
[45] Date of Patent: Mar. 17, 1998

[54] RETICLE CONTAINER WITH CORNER HOLDING

[75] Inventors: Joseph Laganza, East Norwalk, Conn.; Hoon-Yeng Yap, Tempe, Ariz.; Teodorico A. Cruz, Phoenix, Ariz.; Erik Magnussen, Tempe, Ariz.; Craig S. Dunning, Chandler, Ariz.

[73] Assignee: SVG Lithography Systems, Inc., Wilton, Conn.

[21] Appl. No.: 686,085

[22] Filed: Jul. 24, 1996

Related U.S. Application Data

[63] Continuation-in-part of Ser. No. 545,331, Oct. 19, 1995, abandoned.
[51] Int. Cl.[6] ................................................ E65D 73/02
[52] U.S. Cl. ........................... 206/455; 206/453; 206/706; 206/740; 248/154; 248/316.5; 269/254
[58] Field of Search .............................. 206/455, 454, 206/565, 710, 706, 453, 724, 722, 723; 118/500; 248/154, 316.1, 316.5; 269/42, 111, 254

[56] References Cited

U.S. PATENT DOCUMENTS

| | | |
|---|---|---|
| 3,615,006 | 10/1971 | Freed .................................. 206/710 |
| 4,422,547 | 12/1983 | Abe et al. . |
| 4,776,462 | 10/1988 | Kosugi et al. .......................... 206/455 |
| 4,886,169 | 12/1989 | Ayers et al. ............................ 206/710 |
| 5,154,380 | 10/1992 | Risca .................................... 248/154 |
| 5,161,789 | 11/1992 | Rogers .................................. 269/42 |

Primary Examiner—Paul T. Sewell
Assistant Examiner—Luan Z. Bui
Attorney, Agent, or Firm—Fattibene and Fattibene; Paul A. Fattibene; Arthur T. Fattibene

[57] ABSTRACT

A cassette or box for containing and holding a planar substrate such as a reticle having a clamp bar coupled to corner supports by a spring or flexure and a linkage. A clamp bar is pivotally attached to bottom corner supports and a spring or flexure and linked to a top corner support, such that movement of the load bar causes the corner supports to pivot away from a reticle being held only at the corners. An elevation bar is also used to preposition the reticle in one direction. The present invention greatly facilitates the positioning and handling of a reticle as used in photolithography to manufacture semiconductor devices. Additionally, the present invention greatly reduces particulate contamination.

19 Claims, 5 Drawing Sheets

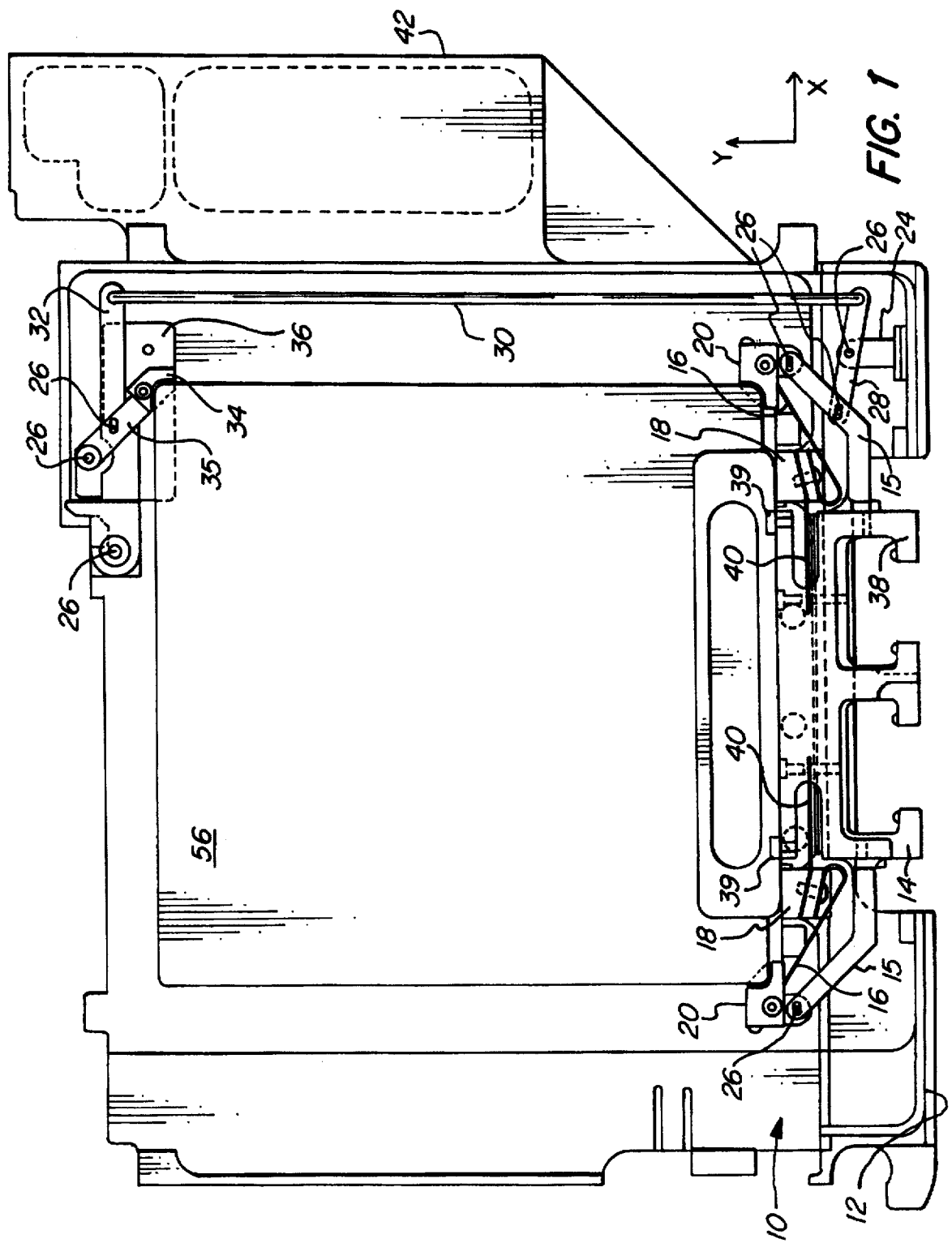

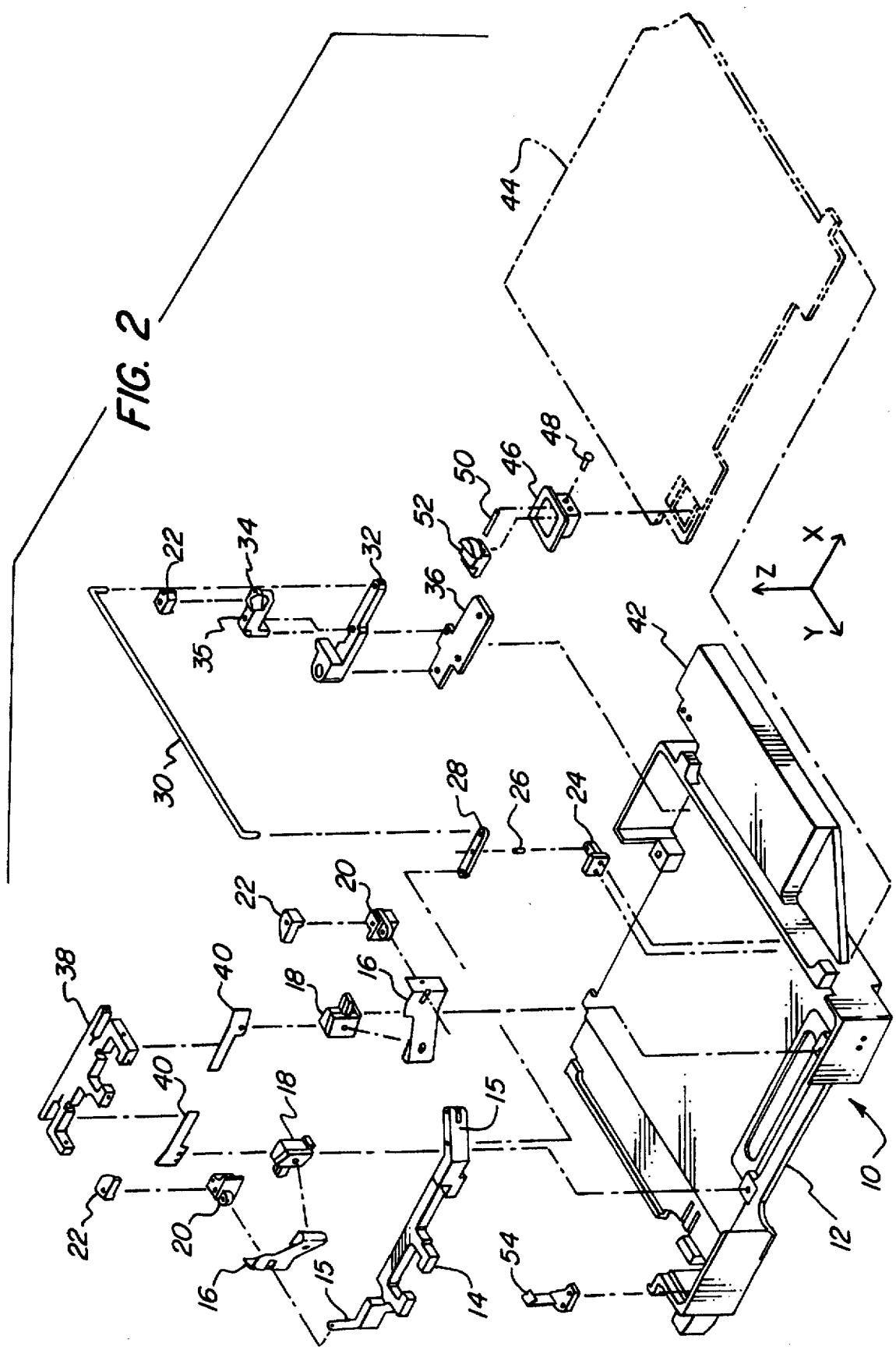

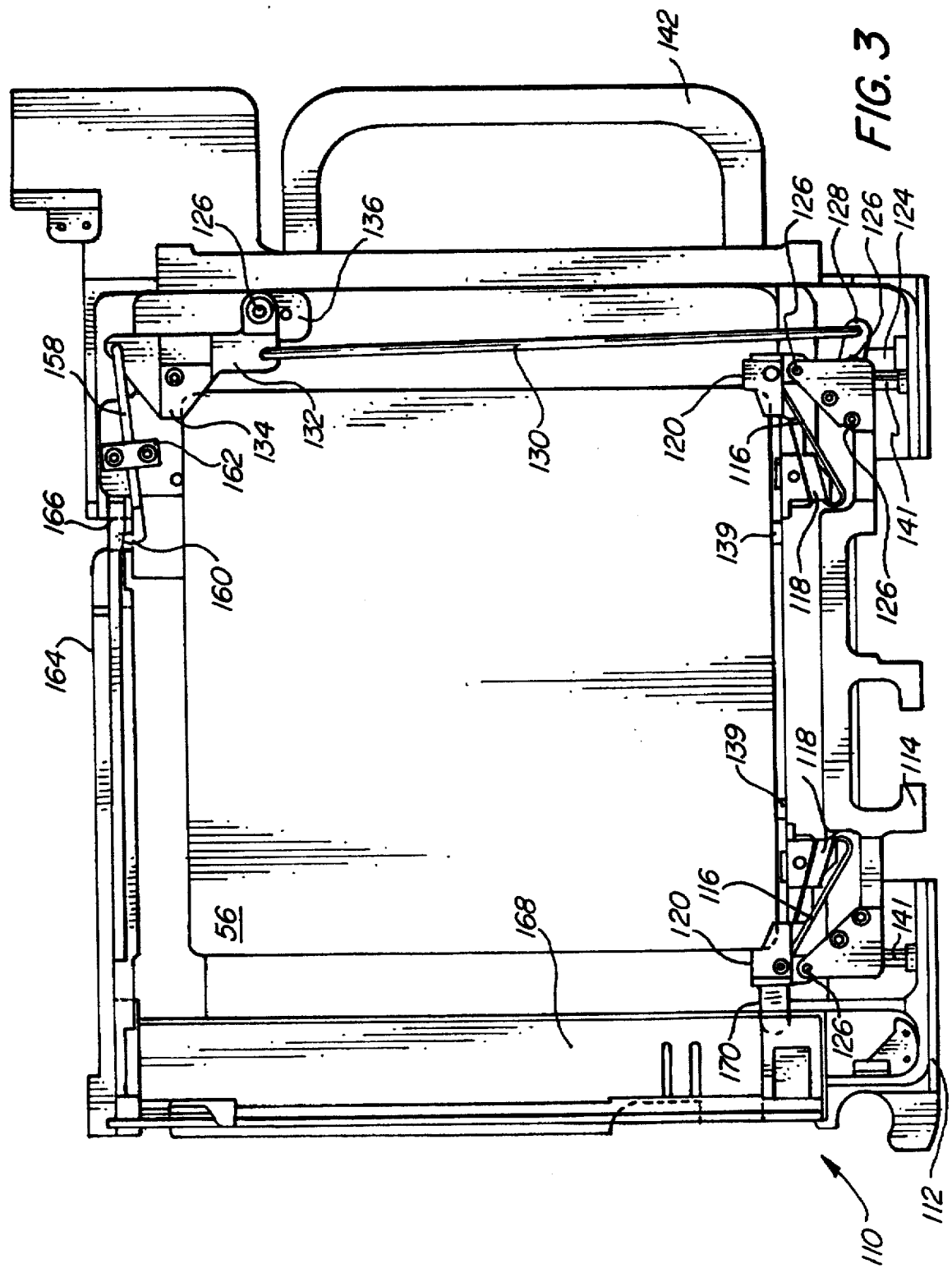

RETICLE CONTAINER WITH CORNER HOLDING

This application is a continuation-in-part of application Ser. No. 08/545,331, filed Oct. 19, 1995, now abandoned.

FIELD OF THE INVENTION

The present invention relates generally to holding a planar substrate for use in photolithography, and more particularly to a container or cassette for releasably holding a reticle.

BACKGROUND OF THE INVENTION

Photolithography is often used in the manufacture of semiconductor devices. In photolithography, an image contained on a reticle is projected onto a wafer having a photosensitive resist thereon. During the manufacturing process, many different reticles may be needed. Each of these different reticles must be held in a secure contamination free environment. One such container for holding a substrate or reticle is disclosed in U.S. Pat. No. 4,422,547 entitled "Container For Holding Substrate" issuing to Abe et al on Dec. 27, 1983. Therein disclosed is a container for holding a planar substrate such as a reticle, mask, or wafer. The container has a contact member that is linked to the motion of a door such that when the door is closed, the contact member touches the top planar surface of the substrate or reticle placed in the container. While this prior container held a reticle, it was not without disadvantages. Therefore, there is a need to improve the containers or cassettes used for holding a reticle. There is additionally a need for a reticle container or cassette that will securely and releasably hold a reticle in a predetermined fixed location without damaging the reticle or contributing to particulate contamination.

SUMMARY OF THE INVENTION

The present invention comprises a reticle box with a displacable clamp bar attached or linked to a plurality of corner supports. The corner supports are attached at one end to a fixed support and at the other end to the clamp bar. One corner support is controlled by a linkage attached to the clamp bar. Upon movement of the clamp bar, the plurality of corner supports are pivoted away from the corners of a reticle. The corner supports hold the reticle securely in a predetermined position. An elevation bar may be is used to obtain an initial preliminary position in one direction.

Accordingly, it is an object of the present invention to securely and releasably hold a reticle in a container or cassette.

It is another object of the present invention to reduce particulate contamination.

It is an advantage of the present invention that the reticle is accurately held in a known or predetermined position within the container or cassette.

It is a further advantage of the present invention that the reticle is securely held, preventing movement within the container or cassette.

It is a feature of the present invention that the reticle is held at the corners of the reticle.

It is another feature of the present invention that the reticle is released with a relatively low force that is applied at a single location with relatively little linear movement.

It is another feature of the present invention that a locking mechanism is used to prevent unintentional release of the reticle.

These and other objects, advantages, and features will become readily apparent in view of the following detailed description.

BRIEF DESCRIPTION OF THE DRAWINGS

FIG. 1 is a top plan view of the present invention.

FIG. 2 is a perspective exploded view of the present invention.

FIG. 3 is a top plan view of another embodiment of the present invention.

DETAILED DESCRIPTION OF THE PREFERRED EMBODIMENT

Figures 4A, 4B:
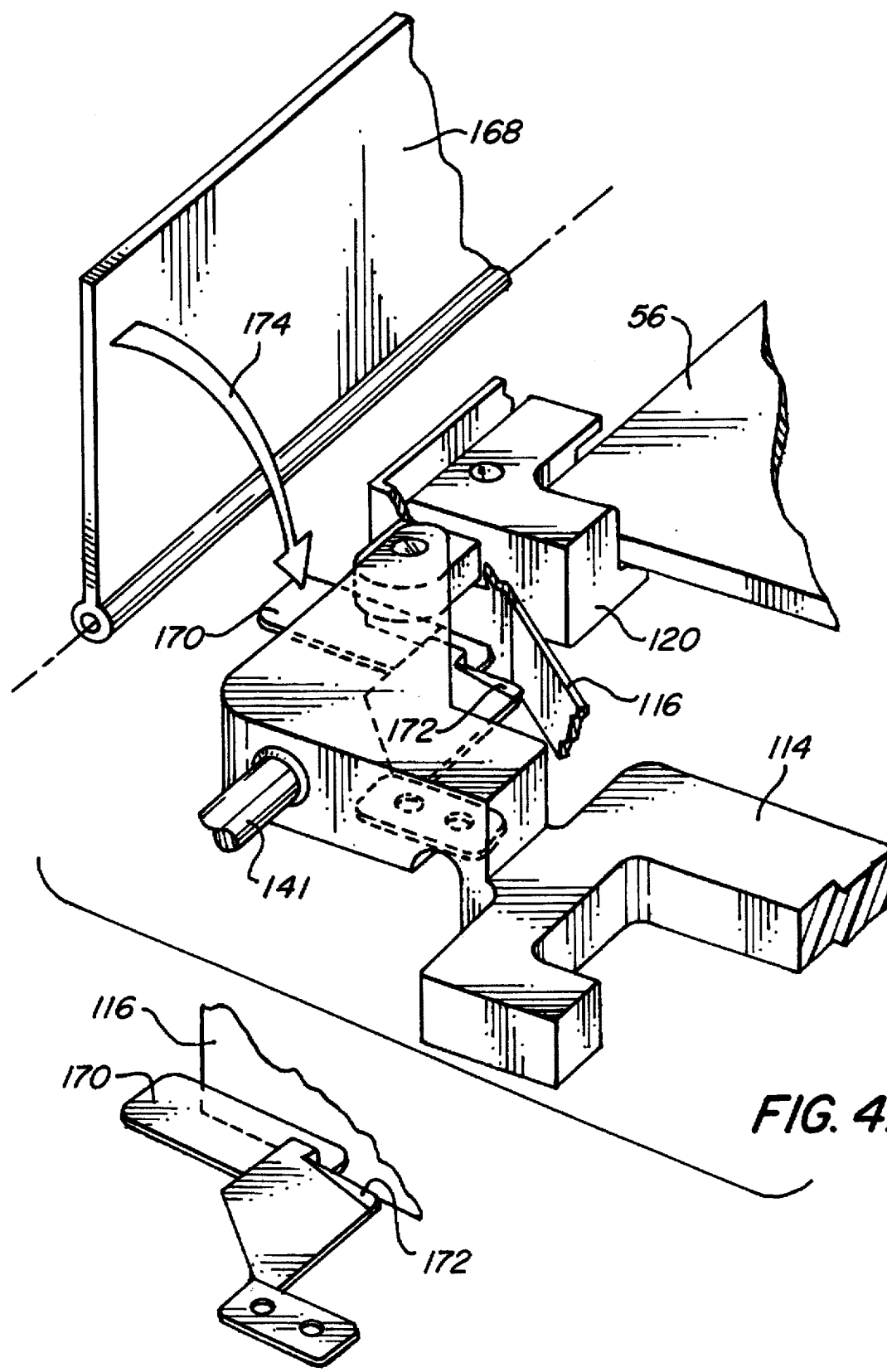
FIGS. 4A–B is a partial perspective view of a corner locking mechanism.

FIG. 1 illustrates the present invention. In FIG. 1, a reticle box, container, or cassette is illustrated having a body 12. Placed within body 12 is a clamp bar 14. Clamp bar 14 has an arm 15 at either end. Each arm 15 is pivotally attached to a bottom corner support 20. Pin 26 attaches arms 15 to the bottom corner supports 20. The bottom corner supports 20 have an indentation or a groove shaped or adapted to fit the corner of a reticle 56. Reticle 56 is typically a planar glass substrate having the image of a pattern to be reproduced by photolithography onto a semiconductor wafer. A clamp bar spring or flexure 16 is attached at one end to the bottom corner supports 20 and at the other end is securely fastened or attached to a fixed support 18. The fixed supports 18 are securely attached to the body 12. Therefore, the fixed supports 18 are unable to move relative to the body 12. One of the arms 15 is pivotally attached to a lever 28 with a pin 26. The lever 28 is pivotally attached to a lever support 24, acting as a fulcrum, with a pin 26. The other end of lever 28 is linked to a top corner support actuator 32 by a connector 30. The connector 30 attaches to one end to the actuator 32. The other end of the actuator 32 is pivotally attached to the body 12 with a pin 26. A top corner support arm 35 is pivotally attached to the body 12 with a pin 26 at one end, and intermediately attached to the actuator 32 with a pin 26. The other end of the support arm 35 has attached thereto a top corner support 34. The top corner support 34 has an indentation or groove for receiving or holding a corner of the reticle 56. The actuator 32 and the support arm 35 are attached to a support mount plate 36.

An elevation bar 38 is attached to one end of elevation bar springs or flexures 40. The other end of the elevation bar springs or flexures 40 are attached to fixed supports 18. Attached to elevation bar 38 are elevation reticle supports 39. The clamp bar 14 and the elevation bar 38 move independently from one another. A handle 42 is provided on the body 12 to facilitate insertion and removal as well as carrying of the reticle box 10. The handle 42 may have an opening therein through which the fingers of an operator's hand may be wrapped around, or simply a depression to facilitate grasping.

FIG. 2 illustrates the present invention, as illustrated in FIG. 1, in exploded view. However, FIG. 2 additionally illustrates a cover 44 and a latch mechanism 46, 48, 50, 52, and 54. The cover 44 is pivotally attached to the body 12. At one corner of the cover 44, a latch housing 46 is contained. The latch housing 46 has a latch guide 48 thereon, together with a latch spring 50 and a latch 52. The latch 52 is adapted to meet with a latch catch 54 attached to the body 12 of the reticle box 10. The cover 44 permits access to the interior of the body 12 for initial placement of a reticle 56.

Referring to FIGS. 1 and 2, the operation of the reticle box 10 is readily appreciated. Generally, the reticle box or cassette 10 is held in a reticle library associated with a photolithography tool or piece of equipment. The reticle box or cassette 10 is inserted and removed from the reticle library with a handle 42. Once the reticle box 10 is positioned into a reticle library an automated arm, not shown, is inserted through a side opening and is used to remove the reticle 56 from the closed reticle box 10. The reticle 56 is removed from the reticle box 10 for transport to a location at which projection optics are used to image the reticle onto a photosensitive substrate, such as a semiconductor wafer. In an automated photolithographic process it is advantageous to precisely position the reticle 56 at a predetermined location, as well as to hold the reticle 56 securely. The reticle 56 is initially positioned within the reticle box 10 by linearly moving or displacing clamp bar 14 and elevation bar 38. Upon moving clamp bar 14 downward in the Y direction, the bottom corner supports 20 are pivoted outward against a biasing force created by springs or flexures 16. One arm 15 is attached to the lever 28 causing lever 28 to move, forcing connector 30 upward. Connector 30 being attached to actuator 32, which is in turn pivotally connected to support arm 35, causes the top corner support 34 to rotate or pivot outwards. The bottom corner supports 20 and the top corner support 34 are now in a position to receive the corners of the reticle 56. However, prior to placement of reticle 56, elevation bar 38 may be positioned against stops so that the reticle is pre-positioned on supports 39 in a predetermined Y direction. Accordingly, when a reticle 56 is placed in the reticle box or cassette 10 and in contact with the supports 39, a predetermined initial Y position is obtained. Upon release of the clamp bar 14, the springs or flexures 16 cause the bottom corner supports 20 and the top corner support 34 to return to a normal position contacting the corners of the reticle 56. As illustrated in FIG. 2, support covers 22 are used on bottom corner supports 20 and top corner support 34. The support covers 22 further help to locate and hold the reticle along the Z axis or direction. Therefore, the reticle 56 is securely held and accurately positioned in the X, Y and Z directions. The reticle is released by pulling down on the clamp bar 14 and if desired, the elevation bar 38.

FIGS. 3–5 illustrate another embodiment of the present invention. The embodiment illustrated in FIGS. 3–5 is similar in structure and operation to the embodiment illustrated in FIGS. 1 and 2, however in the embodiment illustrated in FIGS. 3–5 corner locking mechanisms are used to prevent unintentional movement of the reticle 56. A reticle box 110 has a body 112. A clamp bar 114 is attached to the body 112. The clamp bar is guided by guide post 141. On each end of the clamp bar 114 is pivotally mounted bottom corner supports 120. The bottom corner supports 120 are attached with pins 126. A clamp bar spring or flexure 116 is attached at one end to the bottom corner supports 120. The other end of the clamp bar spring or flexure 116 is attached to clamp bar spring fixed supports 118. One end of the clamp bar 114 is pivotally attached to a lever 128. The fulcrum of the lever 128 is pivotally attached with a pin 126 to a lever support 124. One end of the lever 128 is attached to a connector 130. The other end of the connector 130 is attached to a top corner support actuator 132. The top corner support actuator 132 is pivotally connected to a support mount plate 136 with a pin 126. A top corner support 134 is formed on the top corner support actuator 132. Pivotally connected to one end of the top corner support actuator 132 is a rod 158. At the other end of rod 158 is an angled portion 160. The rod 158 is slidably retained in position by support 162. A spring loaded top door 164 has an opening 166 therein. The opening 166 is sized to receive the angled portion 160 of rod 158.

Associated with one of the bottom corner supports 120, opposite the end having handle 142, is a spring tab 170. Spring tab 170 extends a distance sufficient to contact side door 168 when it is pushed down into the open position. Spring tab 170 is therefore pushed down with the opening of the side door 168. Bottom corner supports 120 and top corner support 134, when closed, hold the reticle 56 in a secure position. Reticle supports 139 help to position the reticle as well as bear some of the reticle weight.

FIGS. 4A and 4B more clearly illustrate the locking mechanism associated with one of the two bottom corner supports 120. In FIG. 4A, the operation of spring tab 170 is clearly illustrated. When spring loaded door 168 is closed, as indicated by arrow 174, it contacts the end of spring tab 170. The spring tab 170 is forced downward. A bearing surface or shoulder 172 formed on the spring tab 170 is also caused to move downward. A portion of the spring or flexure 116 holding the bottom corner support 120 rests on the shoulder 172 when the spring tab 170 is in the raised or normal position. This prevents the bottom corner support 120 from moving out of position when pulled down by the clamp bar 114. Accordingly, when the side door 168 is closed, the bottom corner support is locked in position and cannot be moved. However, when the side door 168 is open, spring tab 170 is pushed downward releasing the bottom corner support 120. This permits the reticle 56 to be released when the clamp bar 114 is moved. A cover associated with the bottom corner support 120 is not illustrated in FIG. 4B, so that the operation of the locking mechanism may be more clearly shown. FIG. 4B more clearly illustrates the shoulder 172 and the portion of the flexure 116 which holds the bottom corner support 120.

Figure 5A:
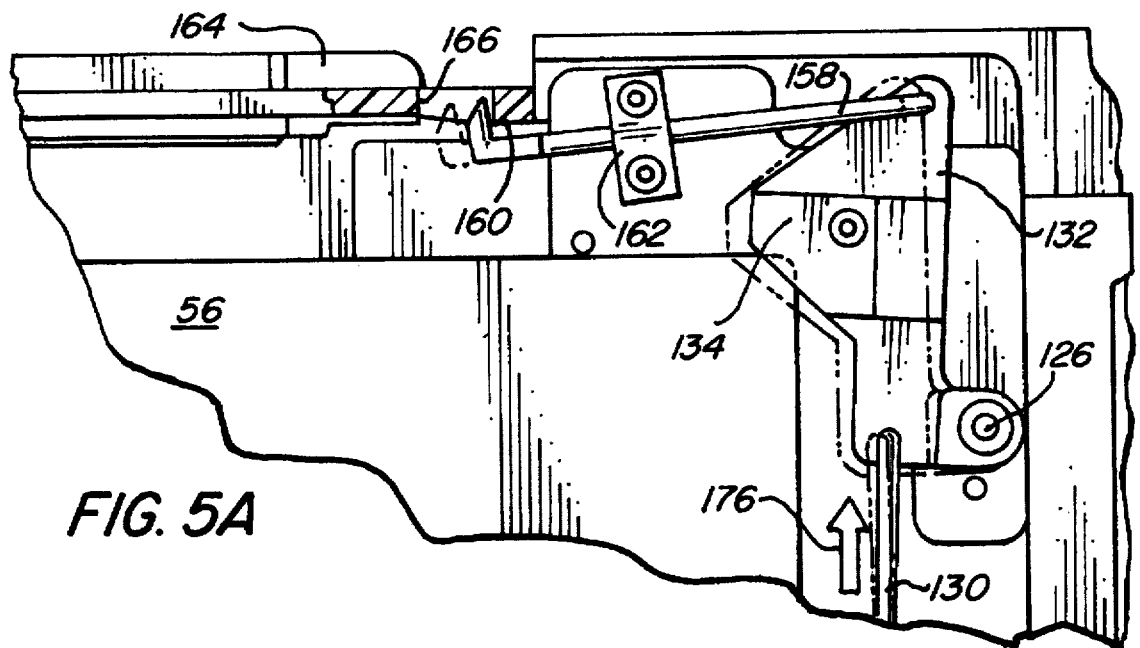
FIGS. 5A–B is a partial top plan view of another corner locking mechanism.
Figure 5B:
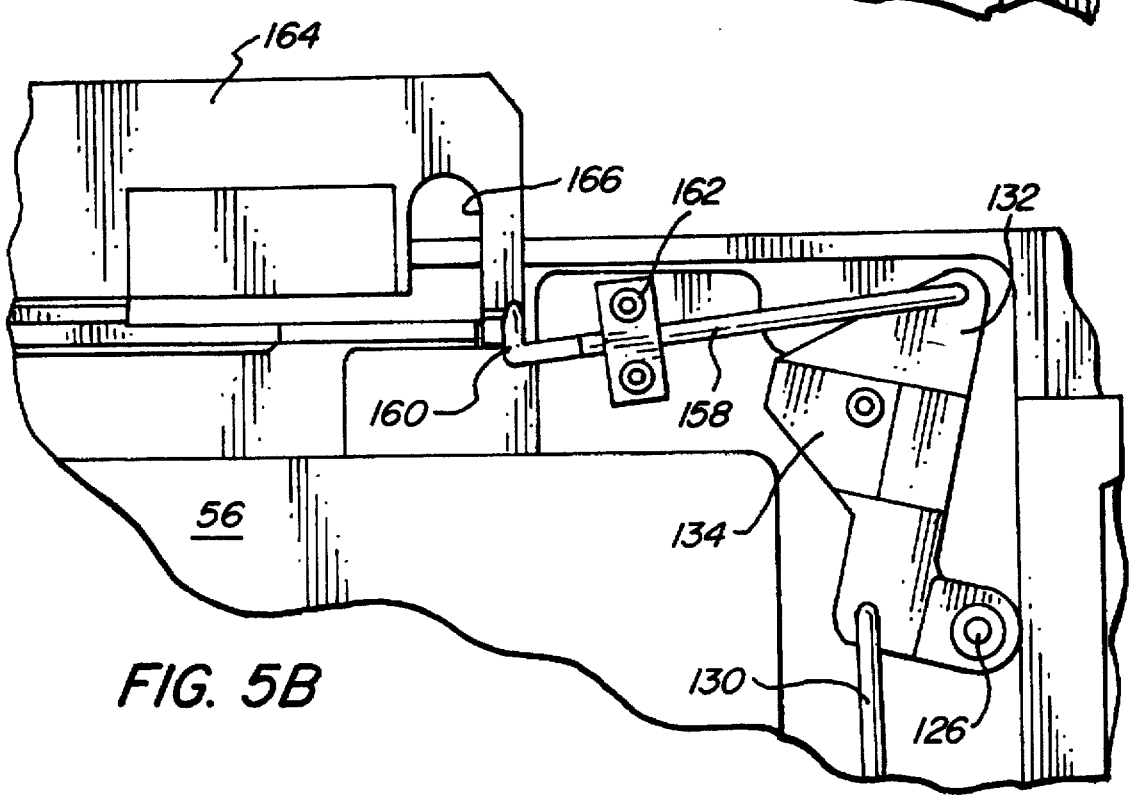

FIGS. 5A and 5B more clearly illustrate the operation of the locking mechanism associated with the top corner support 134. Referring to FIG. 3 and FIGS. 5A and 5B, the operation of the locking mechanism associated with top corner support 134 can be appreciated. When top door 164 is closed, angled portion 160 of rod 158 extends through opening 166. Accordingly, when the clamp bar 114, illustrated in FIG. 3, is lowered, lever 128 pivots pushing attached rod 130 upward, illustrated by arrow 176. The top corner support actuator 132 is forced backward slightly away from the reticle, with the original position illustrated in phantom. However, the top corner support actuator 132 is restrained by the angled portion 160 striking one edge of the opening 166 on top door 164. Preferably, the movement of the top corner support 134 is only very slight, if any, when the top door 164 is closed. Accordingly, when the top door 164 is in the closed position, the top corner support 134 is locked substantially in position holding the reticle 156 securely. FIG. 5B illustrates the release of the locking mechanism when the top door 164 is opened outward away from the reticle 56. When top door 164 is opened, the angled portion 160 is not confined by the opening 166 and is permitted to move backwards or towards the top corner support 134. This releases the top corner support actuator 132, making it free to move. Accordingly, the top corner support 134 swings away from the corner of the reticle 156.

The operation of the reticle box 110 illustrated in FIGS. 3–5 is substantially similar to the operation of the reticle box 10 illustrated in FIGS. 1 and 2 previously described. However, the reticle box illustrated in FIGS. 3–5 has a slightly different linkage mechanism and has the additional feature of a corner locking mechanism to prevent unintentional movement of the reticle 56 contained therein.

The present invention, in securely holding a reticle in a known predetermined position, greatly facilitates the positioning and handling of a reticle during a photolithographic manufacturing process as used in the manufacture of semiconductor devices. However, it should be appreciated that while the holding of a reticle 56 has been described the present invention is applicable to holding any planar substrate. Additionally, the present invention, by providing very few moving parts and holding the reticle only at the corners, has been found to greatly reduce particulate contamination. Particulate contamination is increasingly becoming a problem as the feature size of semiconductor components are reduced. Contact of the reticle and movement of the mechanism of the present invention is kept to a minimum. Additionally, the load bar 14 typically only moves approximately 0.25 inches or 6 millimeters. The present invention also permits positioning accuracy within a range of ±0.010 inches or 0.25 millimeters. The reticle box of the present invention greatly facilitates the handling and transportation of reticles in both a vertical and horizontal position, and permits the reticles to be securely held.

Additionally, although the preferred embodiment has been illustrated and described, it will be obvious to those skilled in the art that various modifications may be made without departing from the spirit and scope of this invention.

What is claimed is:

1. A reticle box comprising:

a body;

a clamp bar;

a plurality of corner supports attached to said clamp bar, said plurality of corner supports arranged to hold a planar substrate; and a spring attached at one end to at least one of said plurality of corner supports and at another end to a support, whereby when said clamp bar is moved, said plurality of corner supports move.

2. A reticle box as in claim 1 wherein:

said spring is a flexure.

3. A reticle box as in claim 1 further comprising:

an elevation bar movably connected to said body; and reticle supports attached to said elevation bar, whereby the reticle can be located in a predetermined position in one direction.

4. A reticle box comprising:

a body;

a clamp bar;

a plurality of corner supports attached to said clamp bar, two of said plurality of corner supports pivotally attached directly to said clamp bar and one of said plurality of corner supports attached through a linkage to said clamp bar; and a spring attached at one end to at least one of said plurality of corner supports and at another end to a support, whereby when said clamp bar is moved, said plurality of corner supports move.

5. A container for holding a planar substrate comprising:

a body;

a clamp bar having a first and second arm;

a first corner support mounted on the first arm;

a second corner support mounted on the second arm;

a third corner support;

a linkage connecting said clamp bar to said third corner support; and a spring coupled to said clamp bar biasing said first, second, and third corner supports into a predetermined position, whereby when said clamp bar is moved against said spring, said first, second, and third corner supports move away from corners of a planar substrate.

6. A container for holding a planar substrate as in claim 5 wherein:

said spring is a flexure.

7. A container for holding a planar substrate as in claim 5 wherein:

said linkage includes a lever attached to said clamp bar;

a connector attached to said lever; and an actuator attached to said connector, said actuator being connected to said third corner support.

8. A container for holding a planar substrate as in claim 5 further comprising:

an elevation bar movably connected to said body; and reticle supports attached to said elevation bar, whereby a reticle can be located in a predetermined position in one direction.

9. A container for holding a planar substrate as in claim 8 wherein:

said elevation bar is connected to said body by a flexure.

10. A container for holding a planar substrate as in claim 5 further comprising:

a cover attached to said body; and a latch attached to said cover.

11. A reticle box comprising:

a body;

a clamp bar having a first and second arm;

a first corner support mounted on the first arm;

a first flexure having a first end and a second end, the first end of said first flexure attached to said first corner support and the second end of said first flexure attached to a support, whereby when said clamp bar is pulled away from said body, said first corner support moves against a biasing force provided by said first flexure;

a second corner support mounted on the second arm;

a second flexure having a first end and a second end, the first end of said second flexure attached to said second corner support and the second end of said second flexure attached to a support, whereby when said clamp bar is pulled away from said body, said second corner support moves against a biasing force provided by said second flexure;

a lever attached to the second arm;

a connector attached to said lever;

an actuator pivotally connected at one end to said body, and to said connector at another end;

a support arm pivotally connected at one end to said body, and to said actuator;

a third corner support attached to a distal end of said support arm; and a cover attached to said body, whereby when said clamp bar is moved away from said body the first, second, and third corner supports are caused to move away from corners of a reticle placed within the reticle box.

12. A reticle box as in claim 11 further comprising:

an elevation bar movably connected to said body; and reticle supports attached to said elevation bar, whereby a reticle can be located in a predetermined position in one direction.

13. A reticle box as in claim 12 wherein:

said elevation bar is connected to said body by a flexure.

14. A reticle box as in claim 11 further comprising:

a latch attached to said cover.

15. A reticle box comprising:

a body;

a clamp bar;

a plurality of corner supports coupled to said clamp bar;

a spring biasing said plurality of corner supports into a predetermined position; and a locking mechanism coupled to at least one of said plurality of corner supports, said locking mechanism preventing movement of the at least one of said plurality of corner supports until being released, whereby when said locking mechanism is released and said clamp bar is moved, said plurality of corner supports move.

16. A reticle box as in claim 15 wherein:

said locking mechanism is a spring tab.

17. A reticle box as in claim 15 wherein:

said locking mechanism is a linkage coupled to said clamp bar and the at least one of said plurality of corner supports.

18. A reticle box as in claim 15 wherein:

said locking mechanism is released by the opening of a door.

19. A reticle box comprising:

a body;

a clamp bar;

a plurality of corner supports coupled to said clamp bar;

a spring biasing said plurality of corner supports into a predetermined position;

locking means, coupled to at least one of said plurality of corner supports, for preventing movement of the at least one of said plurality of corner supports until being released;

a door attached to said body, said door capable of releasing said locking means when said door is opened, whereby when said locking means is released and said clamp bar is moved, said plurality of corner supports move.

* * * * *